(12) United States Patent
Morita et al.

(10) Patent No.: US 11,862,489 B2
(45) Date of Patent: Jan. 2, 2024

(54) SUBSTRATE PROCESSING APPARATUS WITH ELECTRONIC HEATER POWERED BY POWER FEEDING COIL

(71) Applicant: Tokyo Electron Limited, Tokyo (JP)

(72) Inventors: Satoshi Morita, Kumamoto (JP); Kouzou Kawahara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 608 days.

(21) Appl. No.: 17/063,828

(22) Filed: Oct. 6, 2020

(65) Prior Publication Data

US 2021/0118706 A1 Apr. 22, 2021

(30) Foreign Application Priority Data

Oct. 17, 2019 (JP) ................. 2019-190275

(51) Int. Cl.
*H01L 21/67* (2006.01)
*H01L 21/687* (2006.01)
*H05B 6/10* (2006.01)

(52) U.S. Cl.
CPC .. *H01L 21/67103* (2013.01); *H01L 21/68785* (2013.01); *H05B 6/10* (2013.01); *H01L 21/67023* (2013.01)

(58) Field of Classification Search
CPC ......... H01L 21/67103; H01L 21/68785; H01L 21/67023; H01L 21/67051; H01L 21/67248; H01L 21/6875; H01L 21/68792; H01L 21/68764; H05B 6/10; H05B 6/105; H05B 1/0233; H01J 37/32715; H01J 37/32724; H01J 37/32733; H02J 50/12

See application file for complete search history.

(56) References Cited

U.S. PATENT DOCUMENTS

2019/0006209 A1* 1/2019 Wieser ................. F25B 21/02

FOREIGN PATENT DOCUMENTS

| JP | H6-272872 A | 9/1994 |
|---|---|---|
| JP | 2007-335709 A | 12/2007 |
| JP | 2008-034463 A | 2/2008 |
| JP | 2019-507952 A | 3/2019 |
| WO | 2017204083 | 11/2017 |

OTHER PUBLICATIONS

Office Action dated May 29, 2023 for application No. JP 2019-190275 with Machine translation attached.

* cited by examiner

*Primary Examiner* — John P. Dulka
(74) *Attorney, Agent, or Firm* — Nath, Goldberg & Meyer; Jerald L. Meyer; Tanya E. Harkins (57) ABSTRACT

A substrate processing apparatus includes: a rotary stage configured to hold a substrate; a rotary driver configured to rotate the rotary stage around a rotation axis; at least one electric heater installed in the rotary stage; at least one power receiving coil installed in the rotary stage and electrically connected to the electric heater; at least one power feeding coil installed to face the power receiving coil in a direction of the rotation axis with a gap between the power feeding coil and the power receiving coil; and a radio-frequency power supply unit configured to supply radio-frequency power to the power feeding coil.

14 Claims, 7 Drawing Sheets

SUBSTRATE PROCESSING APPARATUS WITH ELECTRONIC HEATER POWERED BY POWER FEEDING COIL

CROSS-REFERENCE TO RELATED APPLICATION

This application is based upon and claims the benefit of priority from Japanese Patent Application No. 2019-190275, filed on Oct. 17, 2019, the entire contents of which are incorporated herein by reference.

TECHNICAL FIELD

The present disclosure relates to a substrate processing apparatus.

BACKGROUND

A process for manufacturing a semiconductor device includes an etching process of etching the surface of a substrate by supplying a chemical liquid to the surface of the substrate while the substrate is being heated and rotated. In this process, it is necessary to rotate the substrate at a high rotation speed while sufficiently heating the substrate, and a substrate processing apparatus configured for that purpose is disclosed in Patent Document 1. This substrate processing apparatus includes a spin chuck, which is provided with a disk-shaped heat generating plate. A coil casing having an annular shape is provided near the bottom of the spin chuck. A plurality of coils are provided inside the coil casing. AC current is supplied to the coil from a coil power supply, thereby generating an alternating magnetic field. The heat generating plate generates heat due to eddy current generated in the heat generating plate to impede the change in the alternating magnetic field, which heats the substrate. An electromagnetic shield plate provided to be in close contact with the top surface of the heat generating plate blocks electromagnetic waves generated by the coil so as to prevent damage to circuit elements already formed on the substrate.

PRIOR ART DOCUMENT

Patent Document

Patent Document 1: Japanese Laid-Open Patent Publication No. 2007-335709

SUMMARY

According to an embodiment of the present disclosure, there is provided a substrate processing apparatus includes: a rotary stage configured to hold a substrate; a rotary driver configured to rotate the rotary stage around a rotation axis; at least one electric heater installed in the rotary stage; at least one power receiving coil installed in the rotary stage and electrically connected to the electric heater; at least one power feeding coil installed to face the power receiving coil in a direction of the rotation axis with a gap between the power feeding coil and the power receiving coil; and a radio-frequency power supply unit configured to supply radio-frequency power to the power feeding coil.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of a substrate processing apparatus will be described with reference to the accompanying drawings.

Figure 1:
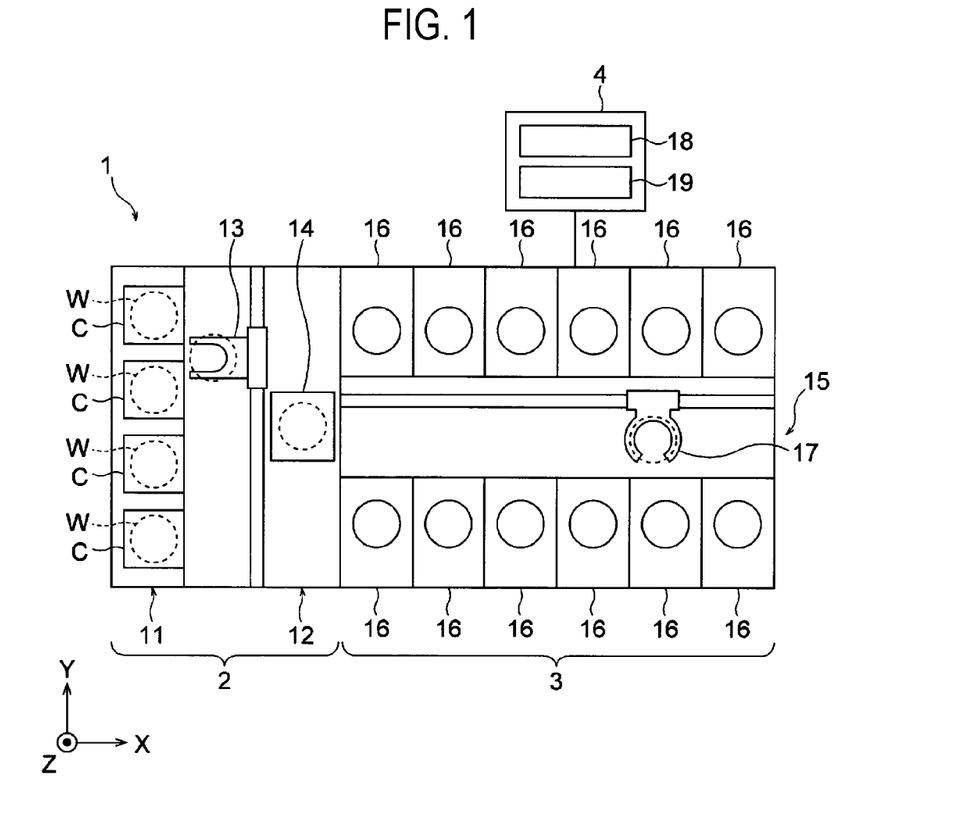
FIG. 1 is a schematic view illustrating a configuration of a substrate processing system according to an embodiment.

FIG. 1 is a schematic view illustrating a configuration of a substrate processing system according to an embodiment. In the following description, in order to clarify positional relationships, an X axis, a Y axis, and a Z axis, which are orthogonal to one another, are defined, and the positive direction of the Z axis is defined as a vertically upward direction.

As illustrated in FIG. 1, a substrate processing system 1 includes a loading/unloading station 2 and a processing station 3. The loading/unloading station 2 and the processing station 3 are provided adjacent to each other.

The loading/unloading station 2 includes a carrier placement part 11 and a transport part 12. A plurality of carriers C, each configured to accommodate a plurality of substrates (semiconductor wafers W in this embodiment) (hereinafter, referred to as "wafers W") in a horizontal state, are placed in the carrier placement part 11.

The transport part 12 is provided adjacent to the carrier placement part 11, and includes therein a substrate transport apparatus 13 and a delivery part 14. The substrate transport apparatus 13 includes a wafer holding mechanism configured to hold a wafer W. In addition, the substrate transport apparatus 13 is capable of moving in the horizontal direction and the vertical direction and rotating about the vertical axis, and thus transports a wafer W between a carrier C and the delivery part 14 using the wafer holding mechanism.

The processing station 3 is provided adjacent to the transport part 12. The processing station 3 includes a transport part 15 and a plurality of processing units 16. The plurality of processing units 16 are arranged side by side on both sides of the transport part 15.

The transport part 15 includes therein a substrate transport apparatus 17. The substrate transport apparatus 17 includes a wafer holding mechanism configured to hold a wafer W. In addition, the substrate transport apparatus 17 is capable of moving in the horizontal direction and the vertical direction and rotating about the vertical axis. The substrate transport apparatus 17 transports a wafer W between the delivery part 14 and a processing unit 16 using the wafer holding mechanism.

The processing unit 16 performs predetermined substrate processing on the wafer W transported by the substrate transport apparatus 17.

In addition, the substrate processing system 1 includes a control device 4. The control device 4 is, for example, a computer, and includes a controller 18 and a storage 19. In the storage 19, a program for controlling various processes executed in the substrate processing system 1 is stored. The controller 18 controls the operation of the substrate processing system 1 by reading and executing the program stored in the storage 19.

Further, such a program may be stored in a computer-readable storage medium, and may be installed in the storage 19 of the control device 4 from the storage medium. The computer-readable storage medium includes, for example, a hard disk (HD), a flexible disk (FD), a compact disc (CD), a magneto-optical disc (MO), and a memory card.

In the substrate processing system 1 configured as described above, first, the substrate transport apparatus 13 of the loading/unloading station 2 removes a wafer W from a carrier C placed in the carrier placement part 11 and places the removed wafer W on the delivery part 14. The wafer W placed on the delivery part 14 is taken out from the delivery part 14 by the substrate transport apparatus 17 in the processing station 3, and is loaded into a processing unit 16.

After being processed by the processing unit 16, the wafer W loaded into the processing unit 16 is unloaded from the processing unit 16 and placed on the delivery part 14 by the substrate transport apparatus 17. Then, the processed wafer W placed on the delivery part 14 is returned to the carrier C in the carrier placement part 11 by the substrate transport apparatus 13.

Next, the configuration of the processing unit 16 will be described with reference to FIG. 2.

The processing unit 16 includes a substrate holding/rotating mechanism 30 having a heating mechanism. The substrate holding/rotating mechanism 30 includes a rotary stage 310 configured to hold a wafer W in a horizontal orientation, that is, a substrate holder, and an electric motor (a rotary driver) 350 configured to rotate the rotary stage 310 around a vertical axis (a rotation axis Ax). FIG. 2 illustrates the rotation axis Ax and a gas passage 354, which will be described later, in an overlapping state.

The rotary stage 310 includes a chuck plate 312, electric heaters 314 and 316, a ferrite plate 318, and power receiving coils 320 and 322 in this order from the upper side. A ferrite ring 324 is provided between the power receiving coils 320 and 322.

The chuck plate 312 is an overall disk-shaped member having a radius larger than that of the wafer W which is a target object. The chuck plate 312 may be formed of, for example, thermally conductive ceramics. Grooves 313 are formed in the top surface of the chuck plate 312. The wafer W is attached to the top surface of the chuck plate 312 by applying a suction force to the grooves 313 in the state in which the wafer W is placed on the top surface of the chuck plate 312.

As the electric heaters 314 and 316, a resistance heater, for example, may be used. As the resistance heater, a polyimide heater, for example, may be used. The electric heaters 314 and 316 are installed on the bottom surface of the chuck plate 312.

Figure 2:
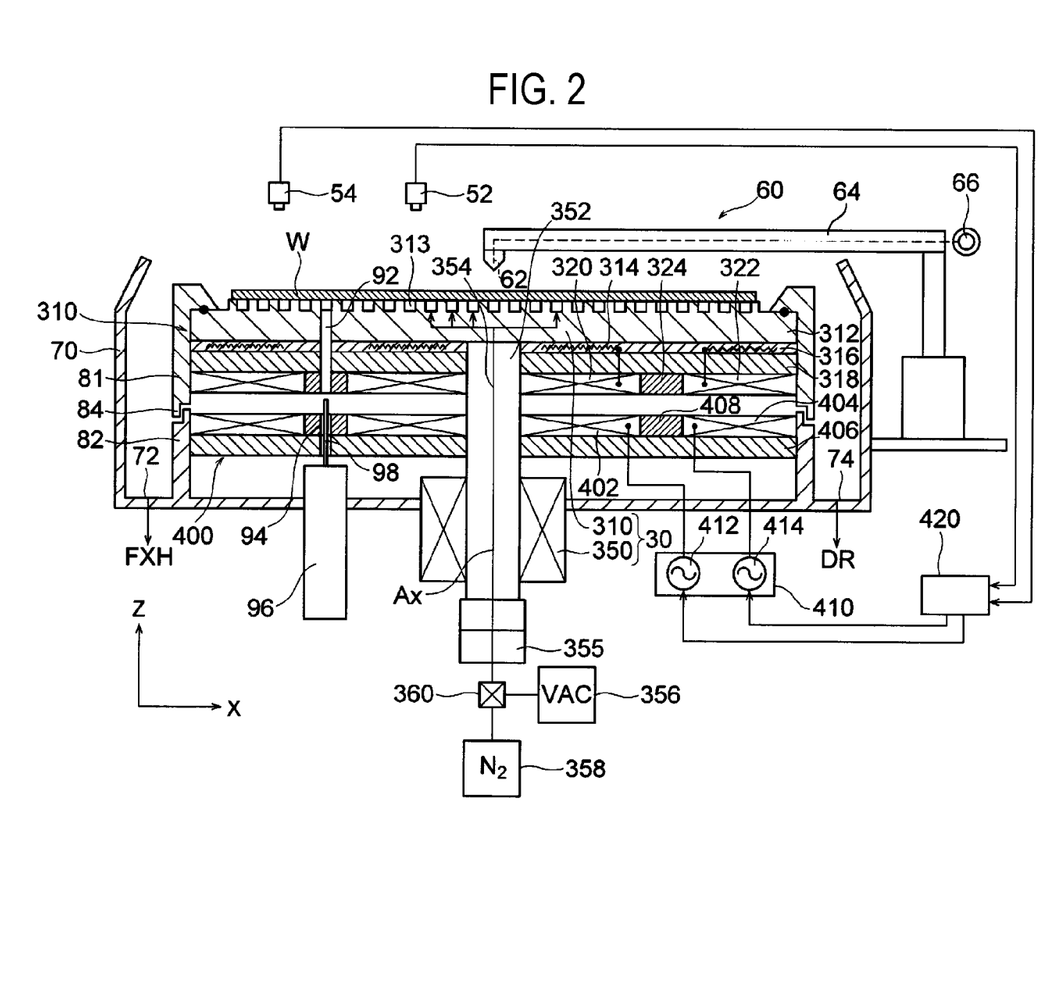
FIG. 2 is a schematic vertical cross-sectional view of a processing unit provided in the substrate processing system of FIG. 1.
Figure 3:
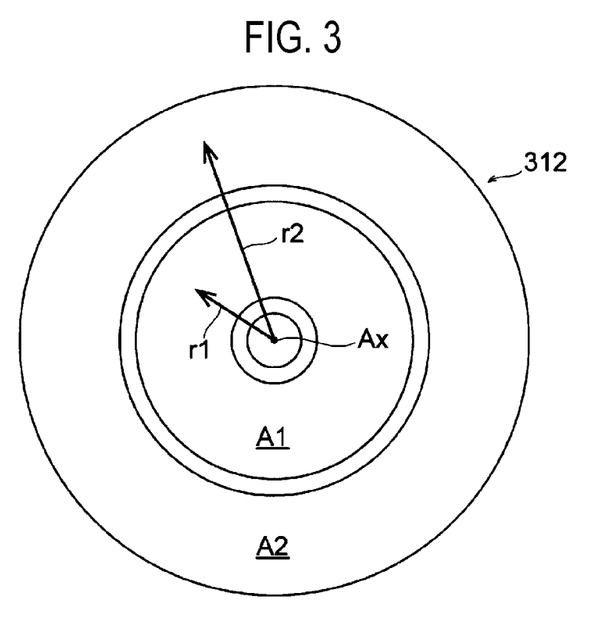
FIG. 3 is a plan view illustrating a heating zone set in a chuck plate of the processing unit of FIG. 2.

As illustrated in FIGS. 2 and 3, the electric heater 314 is installed in a first ring-shaped region A1 in the central region of the bottom surface of the chuck plate 312. The electric heater 314 mainly heats the region A1 of the chuck plate 312. Hereinafter, the electric heater 314 will also be referred to as an "inner heater 314."

The electric heater 316 is installed in a second ring-shaped area A2 in the peripheral portion (outside the central portion) of the bottom surface of the chuck plate 312. The electric heater 316 mainly heats the region A2 of the chuck plate 312. Hereinafter, the electric heater 316 will also be referred to as an "outer heater 316."

In FIG. 3, "r1" means an average of the radius of the inner peripheral edge and the radius of the outer peripheral edge of the region A1, and this is called a "first distance," which represents a distance from the rotation axis Ax to the region A1. In addition, "r2" means an average of the radius of the inner peripheral edge and the radius of the outer peripheral edge of the region A2, and this is called a "second distance," which represents a distance from the rotation center Ax to the region A2. The second distance r2 is greater than the first distance r1.

The region of the chuck plate 312 covered by one electric heater is also called a "heating zone." In the case of this embodiment, two heating zones (an inner heating zone A1 and an outer heating zone A2) are set. Further, the heat generated by the inner heater 314 also heats the outer heating zone, and the heat generated by the outer heater 316 also heats the inner heating zone. However, if the chuck plate 312 is formed sufficiently thin, it is possible to perform temperature control without considering that the inner heater 314 heats the outer heating zone and the outer heater 316 heats the inner heating zone.

When polyimide heaters are used as the electric heaters 314 and 316, the electric heaters 314 and 316 may be formed by an inner heater pattern and an outer heater pattern formed on a common polyimide base material. Although not illustrated in FIG. 3, the heater patterns of the electric heaters 314 and 316 are formed by resistance-heating elements that meander and extend in the regions A1 and A2, respectively.

Instead of the polyimide heaters, another type of electric heater, for example, ceramic heaters, may be used. When the ceramic heaters are used, the resistance-heating elements may be embedded in the chuck plate 312.

The power receiving coils 320 and 322 may be thin (doughnut-shaped) coils having an axis (coil axis) extending in the vertical direction. The axes of the two coils 320 and 322 described above substantially coincide with the rotation axis Ax. The power receiving coil 320 is installed in the central portion of the bottom surface of the disk-shaped ferrite plate 318. Hereinafter, the power receiving coil 320 will also be referred to as an "inner power receiving coil 320." The power receiving coil 322 is installed in the peripheral portion of the bottom surface of the ferrite plate 318. Hereinafter, the power receiving coil 322 will also be referred to as an "outer power receiving coil 322."

An annular ferrite ring 324 is installed between the inner power receiving coil 320 and the outer power receiving coil 322.

When the rotary stage 310 is viewed from directly above, the regions in which the power receiving coils 320 and 322 are located substantially coincide with the first and second ring-shaped regions A1 and A2 in which the electric heaters 314 and 316 are arranged.

When the processing unit 16 is configured to process a 12-inch wafer, as an example, the inner power receiving coil 320 may have an inner diameter of about 30 mm and an outer diameter of about 70 mm, and the outer power receiving coil 322 may have an inner diameter of about 70 mm (+the width of the ferrite ring) and an outer diameter of about 140 mm.

The winding line of the inner power receiving coil 320 is electrically connected to the inner heater 314. The winding line of the outer power receiving coil 322 is electrically connected to the outer heater 316.

The upper end of the rotary shaft 352 of the electric motor 350 is connected to the center of the bottom surface of the chuck plate 312. The chuck plate 312 is integrally connected to the electric heaters 314 and 316, the ferrite plate 318, the power receiving coils 320 and 322, and the ferrite ring 324. Therefore, by operating the electric motor 350, the members 312, 314, 316, 318, 320, 322 and 324 integrally rotate around the vertical axis (the rotation axis Ax).

Inside the rotary shaft 352 of the electric motor 350, the gas passage 354 for transmitting a suction force to the grooves 313 in the top surface of the chuck plate 312 is formed. The gas passage 354 is connected to a vacuum pump 356 and a gas supply source 358 via a rotary joint 355 attached to the lower end of the rotary shaft 352. A switching valve device 360 including, for example, a three-way valve, is installed in the gas passage 354 in order to select only one of the vacuum pump 356 and the gas supply source 358.

By suctioning the inner space of the groove 313 by the vacuum pump 356, the wafer W placed on the chuck plate 312 is attached to the chuck plate 312. By supplying the suction release gas such as nitrogen gas from the gas supply source 358 to the grooves 313, the attachment of the wafer W to the chuck plate 312 is released.

An inner power feeding coil 402 and an outer power feeding coil 404 are installed below the inner power receiving coil 320 and the outer power receiving coil 322 with a vertical gap G therebetween. The inner power feeding coil 402 and the outer power feeding coil 404 are thin (doughnut-shaped) coils having an axis (a coil axis) extending in the vertical direction. The axes of the two coils 402 and 404 described above substantially coincide with the rotation axis Ax.

The gap G is preferably 10 mm or less, and more preferably 5 mm or less. From the viewpoint of power feeding efficiency, the size of the gap G is preferably smaller. However, the minimum value of the size of the gap G is limited from the viewpoint of manufacturing precision of the rotary stage 310, which is a rotating body, and prevention of collision with the power feeding member 400 due to, for example, shaking during operation.

The inner power feeding coil 402 and the outer power feeding coil 404 are installed on the top surface of a disk-shaped ferrite plate 406. When the rotary stage 310 is viewed from directly above, the arrangement regions of the power feeding coils 402 and 404 are the same or substantially the same as the arrangement regions of the power receiving coils 320 and 322. Therefore, regardless of the rotation phase (angular position) of the chuck plate 312, the inner power feeding coil 402 always faces the inner power receiving coil 320 in the direction of the rotation axis Ax, and the outer power feeding coil 404 faces the outer power receiving coil 322 in the direction of the rotation axis Ax.

An annular ferrite ring 408 is installed between the inner power feeding coil 402 and the outer power feeding coil 404.

In order to simplify the technology below, the assembly of the inner power feeding coil 402, the outer power feeding coil 404, the ferrite plate 406, and the ferrite ring 408 will also be referred to as a "power feeding member 400."

Figure 4:
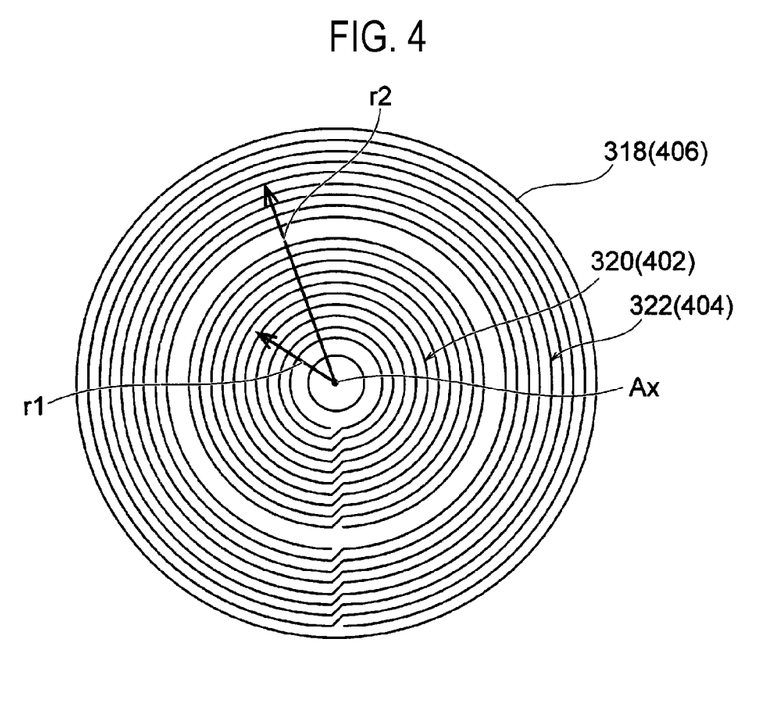
FIG. 4 is a view illustrating an exemplary planar arrangement of a power receiving coil and a power feeding coil.

FIG. 4 schematically illustrates an arrangement of the inner power receiving coil 320 and the outer power receiving coil 322 on the ferrite plate 318. The arrangement of the inner power feeding coil 402 and the outer power feeding coil 404 on the ferrite plate 406 is the same.

As illustrated in FIG. 2, the inner power feeding coil 402 and the outer power feeding coil 404 are supplied with radio-frequency power having a frequency of, for example, about 1 kHz to 4 MHz from a radio-frequency power supply unit 410. The radio-frequency power supply unit 410 has an inner coil power feeding part 412 for supplying radio-frequency power to the inner power feeding coil 402, and an outer coil power feeding part 414 for supplying radio-frequency power to the outer power feeding coil 404. By supplying radio-frequency power to the inner power feeding coil 402 and the outer power feeding coil 404, current flows through the inner power receiving coil 320 and the outer power receiving coil 322 by electromagnetic induction. This current causes the inner heater 314 and the outer heater 316 to generate heat. As described above, power is wirelessly fed to the inner heater 314 and the outer heater 316.

Hereinafter, in order to simplify the technology, the wireless power feeding system to which the inner power feeding coil 402 and the inner power receiving coil 320 belong will also be referred to as an "inner power feeding channel," and the wireless power feeding system to which the outer power feeding coil 404 and the outer power receiving coil 322 belong will also be referred to as an "outer power feeding channel."

The inner coil power feeding part 412 and the outer coil power feeding part 414 supply radio-frequency power having different frequencies. The resonance frequency of the circuit (resonance circuit) including the inner power receiving coil 320 and the inner heater 314 is adapted to substantially match the frequency of the radio-frequency power supplied by the inner coil power feeding part 412. In addition, the resonance frequency of the circuit (resonance circuit) including the outer power receiving coil 322 and the outer heater 316 is adapted to substantially match the frequency of the radio-frequency power supplied by the outer coil power feeding part 414. This makes it possible to prevent mutual interference between the inner power feeding channel and the outer power feeding channel.

The power receiving coils 320 and 322 mainly provide an inductance L in the resonance circuit, and the electric heaters 314 and 316 mainly provide a resistance R in the resonance circuit. In order to adjust the resonance frequency of the resonance circuit, a capacitor having a capacitance C may be provided in the circuit described above. It is preferable to use a capacitor having a fixed capacitance. The resonance frequency may be adjusted according to the known principle of LCR resonance circuits.

Figure 5:
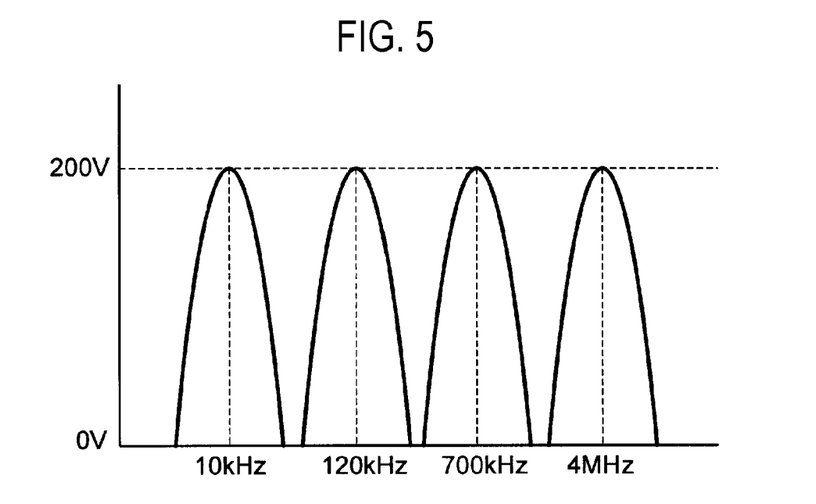
FIG. 5 is a view for explaining a frequency of radio-frequency power supplied to the power feeding coil.

FIG. 5 schematically illustrates a relationship between frequency and output voltage of a power receiving coil. For example, the circuit including the inner power receiving coil 320 may be configured to have a characteristic indicated by the leftmost curve, and the circuit including the outer power receiving coil 322 may be configured to have a characteristic indicated by the second curve from the left. As illustrated in FIG. 5, it is preferable that the frequencies at which the output voltage exhibits a peak value, that is, the resonance frequencies, are sufficiently spaced apart from each other such that the characteristic curves, in which mutual interference between the power feeding channels is a problem, do not overlap each other. In the case of providing more than two power feeding channels, design may be made based on the same concept.

Ferrite acts as an electromagnetic shield. For this reason, it is possible to prevent the electronic devices constituting the processing unit 16 above the ferrite plate 318 and below the ferrite plate 406 from malfunctioning due to electromagnetic waves. In addition, it is possible to prevent the electronic devices or semiconductor devices already formed on a wafer W from being damaged by an abnormal temperature increase due to radio-frequency induction heating.

By providing the ferrite rings 324 and 408, it is possible to prevent mutual interference between the inner power feeding channel and the outer power feeding channel. As a result, it becomes possible to individually control the amount of heat generated by the inner heater 314 and the outer heater 316 with high precision.

Since it is difficult for eddy current to flow in the ferrite, abnormal heat generation due to radio-frequency induction heating does not occur in the ferrite plates 318 and 406 and the ferrite rings 324 and 408, and since it is possible to suppress power loss to a low level, power feeding efficiency is also improved. For example, it has been confirmed through tests that power feeding efficiency of about 90% was obtained.

Above the chuck plate 312 of the rotary stage 310, non-contact temperature sensors 52 and 54 are provided. The non-contact temperature sensors 52 and 54 may be, for example, infrared (IR) temperature sensors. The temperature sensor 52 is capable of detecting the temperature of the central portion of the top surface of the chuck plate 312 or the central portion of the wafer W placed on the chuck plate 312, and will also be referred to as an "inner temperature sensor 52." The temperature sensor 54 is capable of detecting the temperature of the peripheral portion of the top surface of the chuck plate 312 or the peripheral portion of the wafer W placed on the chuck plate 312, and will also be referred to as an "outer temperature sensor 54."

The operation of the radio-frequency power supply unit 410 is controlled by a temperature controller 420. The temperature detected by the inner temperature sensor 52 and the outer temperature sensor 54 are input to the temperature controller 420. The inner temperature sensor 52, the outer temperature sensor 54, and the temperature controller 420 may be connected by a wire. Based on the difference between the temperature detected by the inner temperature sensor 52 and the set temperature, the temperature controller 420 controls feedback of the power feeding to the inner power feeding coil 402 by the inner coil power feeding part 412. Based on the difference between the temperature detected by the outer temperature sensor 54 and the set temperature, the temperature controller 420 controls feedback of power feeding to the outer power feeding coil 404 by the outer coil power feeding part 414.

The feedback control may be, for example, PID control or ON/OFF control. As the ON/OFF control, hysteresis control may be used, for example, when the values detected by the temperature sensors 52 and 54 exceed an OFF set temperature (e.g., a target temperature +2 degrees C.), the power feeding is turned off, and when the values detected by the temperature sensor fall below an ON set temperature (e.g. the target temperature −2 degrees C.), the power feeding is turned on. The control of the supplied power in the PID control may be performed by duty control of, for example, pulse width modulation (PWM) (which is microscopically a control involving ON/OFF operation, but is different from the ON/OFF control described above).

In both cases of performing hysteresis (ON/OFF) control and performing duty control, it is preferable to turn on/off the power feeding in the vicinity of zero volts of an AC load voltage. As a result, it is possible to suppress the generation of switching noise and inrush current.

Instead of the non-contact-type temperature sensors 52 and 54 described above, a contact-type temperature sensor (not illustrated) embedded in the chuck plate 312 may be used. In this case, the temperature detected by the contact-type temperature sensor may be transmitted to the temperature controller 420 by a wireless transmission device that operates using the power extracted from at least one of the inner power receiving coil 320 and the outer power receiving coil 322.

However, in the rotary stage 310, which rotates at a relatively high speed and is located in a strong electromagnetic field, it is preferable to avoid installation of a device (actuator) that performs electrical operations such as switching, control, and transmission/reception (e.g., SSR or MPU), or a device that performs mechanical operations as much as possible.

The processing unit 16 is provided with a processing liquid supply part 60 configured to supply a processing liquid, such as a chemical liquid (e.g., an etching liquid or a cleaning liquid), a rinsing liquid, a drying solvent, or a drying gas, to a surface (the surface to be processed) of a wafer W held by the substrate holding/rotating mechanism 30. The processing fluid supply part 60 includes at least one nozzle 62, at least one nozzle arm 64 (a nozzle moving mechanism) configured to carry and move the nozzle 62, and a processing fluid supply mechanism 66 configured to supply a processing liquid to the nozzle 62.

The nozzle arm 64 is capable of moving the carried nozzle 62 between a processing position above the center of the wafer W and a standby position outside the wafer W.

Although not illustrated in detail, the processing liquid supply mechanism 66 includes, for example, a factory power source, a pipe (pipeline) connected to a processing liquid supply source, such as a tank and a cylinder, and a flow control device (e.g., an opening/closing valve, a flow meter, or a flow rate control valve) disposed in the pipe.

The processing unit 16 has a liquid receiving cup 70 installed around the substrate holding/rotating mechanism 30 so as to collect the processing liquid scattered from the rotating wafer W. The liquid receiving cup 70 has an exhaust port 72 for evacuating the internal space in the liquid receiving cup 70, and a drain port 74 for discharging the liquid from the liquid receiving cup 70.

The processing unit 16 has a chamber (housing), which is not illustrated in FIG. 2, and the components illustrated in FIG. 2 are arranged in this chamber. A fan filter unit (FFU) may be installed on the ceiling of the chamber.

An upper protective cover 81 and a lower protective cover 82 are installed to protect the constituent elements of the rotary stage 310 and the constituent elements of the power feeding member 400 from a corrosive atmosphere (e.g., an atmosphere derived from a chemical liquid).

The upper protective cover 81 covers the periphery of the rotary stage 310, which is a rotating body, and the lower protective cover 82 covers the periphery of the power feeding member 400, which is a non-rotating body. The lower end of the upper protective cover 81 and the upper end of the lower protective cover 82 are configured to form a non-contact seal 84, for example, a labyrinth seal, as schematically illustrated in FIG. 2. This makes it possible to prevent the mist of a processing liquid from entering the space inside the upper protective cover 81 and the lower protective cover 82 from the space outside the upper protective cover 81 and the lower protective cover 82 while enabling the upper protective cover 81 and the lower protective cover 82 to rotate relative to each other.

The mist of the processing liquid may be prevented from entering the space inside the upper protective cover 81 and the lower protective cover 82 from the space outside the upper protective cover 81 and the lower protective cover 82 by increasing the pressure inside the upper protective cover 81 and the lower protective cover 82 by supplying gas to the space inside the upper protective cover 81 and the lower protective cover 82.

As illustrated in FIG. 2, the lower end of the lower protective cover 82 may be connected to the liquid receiving cup 70.

Each of the constituent elements of the rotary stage 310 and the constituent elements of the power feeding member 400 includes one or more, preferably three or more, lift pin holes 92 and 94 (only one of the lift pin holes 92 and only one of the lift pin holes 94 being illustrated in FIG. 2). When the lift pin holes 92 and 94 penetrate the ferrite as in the exemplary configuration illustrated in FIG. 2, eddy current having a problematic size is not generated by magnetic flux leaking through the holes having a size similar to that of the lift pine holes 92 and 94. In the case of adopting a configuration in which the lift pin holes 92 and 94 penetrate the portion in which no ferrite is present, it is preferable to surround at least the outer peripheries of the lift pin holes with a magnetic material (ferrite) in order to suppress the influence of eddy current. A lift pin 98 which is raised and lowered by a linear actuator 96 (e.g., an air cylinder) is inserted into each lift pin hole 94 in the power feeding member 400. When the rotary stage 310 is positioned at a specific angular position (rotation phase) such that the lift pin holes 92 in the rotary stage 310 and the lift pin holes 94 in the power feeding member 400 are aligned, it is possible to raise and lower the lift pins 98 through the lift pin holes 92 in the rotary stage 310.

The wafer W placed on the chuck plate 312 can be lifted by raising the tips of the lift pins 98 to a position above the top surface of the chuck plate 312. In this state, the wafer W can be delivered between the lift pins 98 and the arm of the substrate transport apparatus 17 (see FIG. 1). The wafer W can be placed on the top surface of the chuck plate 312 by lowering the tips of the lift pins 98 supporting the wafer W to a position below the top surface of the chuck plate 312.

The liquid processing of a wafer W performed by the processing unit 16 will be briefly described.

The wafer W loaded into the processing unit 16 is attached to the chuck plate 312 by suction. In this state, by operating the electric motor 350, the wafer W held by the chuck plate 312 is rotated. At this time, power is fed from the radio-frequency power supply unit 410 to the inner power feeding coil 402 and the outer power feeding coil 404. As a result, a current generated by electromagnetic induction flows from the inner power receiving coil 320 to the inner heater 314 and then from the outer power receiving coil 322 to the outer heater 316. By the feedback control described above, the temperature of the central portion of the wafer W heated by the inner heater 314 and the temperature of the peripheral portion of the wafer W heated by the outer heater 316 are respectively controlled to desired values.

A processing liquid, such as a chemical liquid, is supplied to the surface of the wafer W from the nozzle 62 of the processing fluid supply part 60 in the central portion of the surface of the rotating wafer W, the temperature of which is controlled, whereby chemical liquid processing is performed on the surface of the wafer W. By moving the nozzle 62, a liquid application point of the chemical liquid ejected from the nozzle 62 on the wafer surface may be moved (e.g., reciprocated between the central portion and the peripheral portion of the wafer).

After the completion of the chemical liquid processing, the processing liquid supply part 60 may perform a rinsing process by supplying a rinsing liquid (e.g., pure water (DIW)) to the wafer W, and may then perform a drying process (e.g., a centrifugal drying process) of the wafer W. Between the rinsing process and the drying process, a drying fluid replacement process may be performed, in which the rinsing liquid is replaced with a drying fluid such as isopropyl alcohol (IPA). When performing the drying process, IPA and a drying gas, such as nitrogen gas, may be simultaneously supplied to the wafer W.

Heating by the inner heater 314 and the outer heater 316 may be performed only when performing the chemical liquid processing. In order to accelerate drying, heating by the inner heater 314 and the outer heater 316 may be performed during the drying process (that is, when the processing liquid is not supplied to the wafer W).

According to the embodiment described above, it is possible to heat the wafer W by the electric heater through non-contact power feeding from the non-rotating power feeding coil (power transmission coil) to the power receiving coil rotating together with the chuck plate holding the wafer W and the electric heater. A complicated contact-type mechanism for feeding power to the rotating electric heater (e.g., a power feeding mechanism using a rolling bearing or a snap ring) is not necessary.

According to the embodiment described above, it is possible to heat the wafer W through the chuck plate 312, regardless of whether the rotary stage 310 (a substrate holding part) is rotating or not, and regardless of the rotation speed. Even when the liquid processing of the wafer W is performed at a high temperature, it is possible to perform the liquid processing of the wafer W while rotating the wafer W. Therefore, it is possible to process the wafer W while removing a reaction product from the surface of the wafer W, and thus liquid processing quality can be improved.

According to the embodiment described above, by supplying the chemical liquid at normal temperature to the wafer W which is heated and rotated, it is possible to perform the liquid processing while maintaining the temperature of the interface between the surface of the wafer W and the chemical liquid high. In this case, since it is not necessary to heat the chemical liquid before supplying the same, it is possible to suppress consumption of the chemical liquid.

According to the embodiment described above, since the current controlled through the inner power receiving coil 320 and the outer power receiving coil 322 is supplied to the inner heater 314 and the outer heater 316, it is possible to control the amount of heat generated by the heaters 314 and 316, and hence to control the temperature of the wafer W with high precision. According to the embodiment described above, compared to, for example, the case of adopting a method of heating a metal heating member provided in the chuck part by radio-frequency induction heating, it is possible to control the temperature and temperature distribution of the wafer W more precisely. Therefore, it is possible to improve liquid processing quality.

Further, according to the embodiment described above, it is possible to independently control the temperature of the central portion of the wafer and the temperature of the peripheral portion of the wafer using the inner heater 314 and the outer heater 316. Therefore, by increasing the amount of heat generated by the heater 314 or 316 corresponding to a region of the wafer, in which the temperature tends to be lower, to be higher than that of the other heater, it is possible to make the temperature at the interface between the wafer surface and the processing liquid uniform in the plane of the wafer W. Therefore, it is possible to improve the in-plane uniformity of processing.

The following are examples of the causes of the temperature difference between the central portion and the peripheral portion of a wafer.

(1) The relative velocity between the atmosphere (e.g., air) surrounding the wafer W and the surface of the wafer W is higher at the peripheral portion where the peripheral velocity (distance r from the rotation center of the wafer in a radial direction×angular velocity ω) is higher. Thus, the peripheral edge of the wafer W is easily cooled.

(2) When a high-temperature processing liquid is supplied to the central portion of the wafer W having a temperature lower than the temperature of the processing liquid, the processing liquid spreads to the peripheral portion of the wafer W while heat is transferred therefrom to the wafer W. Thus, the temperature of the processing liquid decreases toward the peripheral edge.

(3) When supplying a highly volatile processing liquid to the central portion of the wafer W, heat removed from the wafer W by vaporization of the processing liquid increases toward the peripheral edge.

Figure 6:
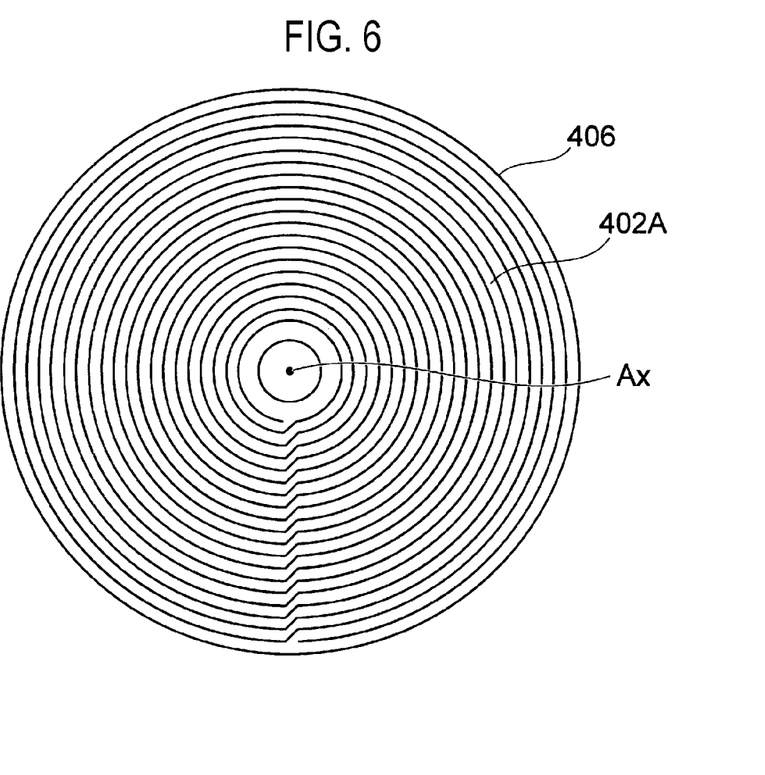
FIG. 6 is a view for explaining another exemplary planar arrangement of a power feeding coil.

Next, a first modification of the present embodiment described above will be described. In the first modification, as illustrated in FIG. 6, on the top surface of the ferrite plate 406, there is provided only one large doughnut-shaped power feeding coil 402A centered on the rotation axis Ax. Two power receiving coils 320 and 322 described above with reference to FIG. 3 are installed on the bottom surface of the ferrite plate 318. Electric heaters 314 and 316 are electrically connected to the power receiving coils 320 and 322, respectively.

When the rotary stage 310 is viewed from directly above, the arrangement regions of the power receiving coils 320 and 322 are included in the arrangement region of the large power feeding coil (the first power feeding coil) 402A. That is, the large power feeding coil 402A is arranged to face both the power receiving coils 320 and 322, regardless of the rotation phase of the rotary stage.

In the first modification, the radio-frequency power supply unit 410 is configured as a radio-frequency power supply unit, the output frequency of which is variable. That is, the radio-frequency power supply unit 410 is configured to be capable of selectively supplying, to the power feeding coil 402A, a frequency corresponding to (substantially the same as) the resonance frequency of the resonance circuit to which the power receiving coil 320 belongs (a first resonance frequency) and a frequency corresponding to the resonance frequency of the resonance circuit to which the power receiving coil 322 belongs (a second resonance frequency). In this case, the radio-frequency power supply unit 410 may include a first coil power feeding part 412 configured to steadily output the radio-frequency power having the first resonance frequency, a second coil-feeding part 414 configured to steadily output the radio-frequency power having the second resonance frequency, and a switch configured to electrically connect only one of the first coil power feeding part 412 and the second coil power feeding part 414 to the power feeding coil 402A. Alternatively, the radio-frequency power supply unit 410 may have a single coil power feeding part having a variable output frequency. The radio-frequency power supply unit 410 may include a zero-cross circuit.

It is possible to selectively heat the electric heaters 314 and 316 by switching the frequency output from the radio-frequency power supply unit 410. By switching the frequency output from the radio-frequency power supply unit 410 at high speed, it is possible to cause the electric heaters 314 and 316 to be heated substantially at the same time. By adjusting the ratio of the energization times of the electric heaters 314 and 316, it is possible to control the ratio of the amount of heat generated by the electric heaters 314 and 316.

Figure 7:
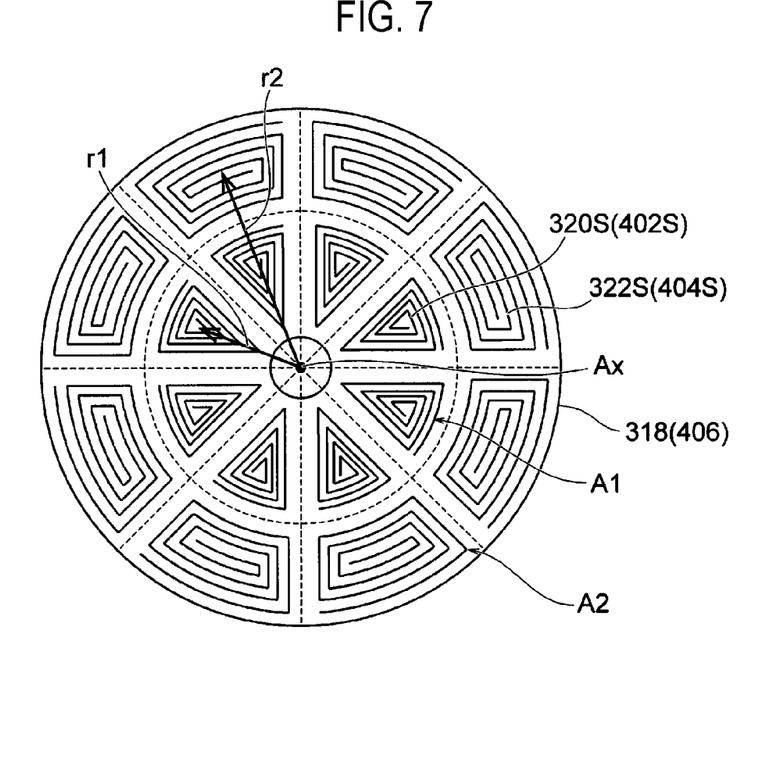
FIG. 7 is a view for explaining another planar arrangement of power receiving coils and power feeding coils.

Next, a second modification will be described. As illustrated in FIG. 7, the second modification includes a plurality of (eight in the illustrated example) inner power receiving coils 320S and a plurality of (eight in the illustrated example) outer power receiving coils 322S.

Like the inner power receiving coil 320 described above, the plurality of inner power receiving coils 320S are arranged in a ring-shaped region A1 in which the distance from the rotation axis Ax (the first distance r1) is relatively small. Further, the plurality of inner power receiving coils 320S are arranged at different circumferential positions in the ring-shaped region A1 at equal intervals in the circumferential direction.

Like the outer power receiving coil 322 described above, the plurality of outer power receiving coils 322S are arranged in a ring-shaped region A2 in which the distance from the rotation axis Ax (the first distance r2) is relatively large. The plurality of outer power receiving coils 322S are arranged at different circumferential positions in the ring-shaped region A2 at equal intervals in the circumferential direction.

In the second modification, one electric heater (not illustrated) is electrically connected to one inner power receiving coil 320S so as to form one resonance circuit. The resonance frequencies of the resonance circuits belonging to different inner power receiving coils 320S are different from each other. One electric heater (not illustrated) is electrically connected to one outer power receiving coil 322S so as to form one resonance circuit. The resonance frequencies of resonance circuits belonging to different outer power receiving coils 322S are different from each other.

In this second modification, a plurality of recesses having shapes matching the shapes of the power receiving coils 320S and 322S and the power feeding coils 402S and 404S may be formed on the bottom surface of the ferrite plate 318 and the top surface of the ferrite plate 406. One coil may be stored in each recess. In this case, the ferrite ring may not be provided.

The radio-frequency power supply unit 410 is installed with one coil power feeding part for one power feeding coil 402S or 404S. Different coil power feeding parts supply radio-frequency power of different frequencies.

In the second modification, while the rotary stage 310 is rotating, when the power receiving coils 320S or 322S face the power feeding coils 420S or 404S supplied with radio-frequency power of a frequency corresponding to the resonance frequency of the resonance circuit, which belongs to the power receiving coil, in the direction of the rotation axis Ax, sufficiently large current flows through the electric heater connected to the power receiving coil.

In addition, in the second modification, by positioning the rotary stage 310 such that the resonance frequency of the power receiving coils facing the power feeding coils matches with the frequency of power fed to the power feeding coils, it is possible to supply sufficiently large current to all of the power receiving coils when the rotation of the rotary stage 310 is stopped.

According to the second modification, it is possible to set a plurality of heating zones along the circumferential direction. Therefore, even if a non-uniform temperature distribution occurs along the circumferential direction of the wafer W, it is possible to eliminate or reduce the same.

When a plurality of heating zones are set at the same radial position as in the second modification, it is preferable to control power feeding from the radio-frequency power supply unit 410 through the temperature controller 420 using a contact-type temperature sensor embedded into the chuck plate 312.

Various other modifications are possible. For example, the arrangement of the power feeding coil illustrated in FIG. 4 and the arrangement of the power receiving coils illustrated in FIG. 7 may be combined. In this case, in the radio-frequency power supply unit 410, radio-frequency power is supplied to the inner power feeding coil 402 and the outer power feeding coil 404 illustrated in FIG. 4 from the variable-frequency inner coil power feeding part 412 and outer coil power feeding part 414.

From the viewpoint of ease of manufacture, when the rotary stage 310 is viewed from above, it is preferable that the heating zone (heater arrangement region) and the power receiving coil arrangement region be the same or substantially the same (see, for example, FIGS. 3 and 4). However, since the electric heaters and the power receiving coils are connected by a wire, the heaters and coils do not necessarily have to have such an arrangement.

It should be understood that the embodiments disclosed herein are illustrative and are not limiting in all aspects. The above-described embodiments may be omitted, replaced, or modified in various forms without departing from the scope and spirit of the appended claims.

Processing performed on a wafer W is not limited to liquid processing such as wet etching processing or chemical liquid cleaning processing, and may be coating processing for applying a film, such as a resist film or an antireflection film, to the surface of the wafer W. In the case of the coating processing, in addition to applying a film forming liquid while heating the wafer W, it is possible to bake the wafer W, for example, immediately after the film forming liquid is applied while rotating the wafer W.

The substrate which is a target object is not limited to a semiconductor wafer, but may be any of various substrates used in the semiconductor device manufacturing field, such as a glass substrate or a ceramic substrate.

According to the present disclosure, it is possible to control the temperature distribution of a substrate with high precision.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a rotary stage configured to hold a substrate;
a rotary driver configured to rotate the rotary stage around a rotation axis;
at least one electric heater installed in the rotary stage;
at least one power receiving coil installed in the rotary stage and electrically connected to the at least one electric heater;
at least one power feeding coil installed to face the at least one power receiving coil in a direction of the rotation axis with a gap between the at least one power feeding coil and the at least one power receiving coil; and
a radio-frequency power supply unit configured to supply radio-frequency power to the at least one power feeding coil,
wherein the at least one electric heater includes a first heater and a second heater, the at least one power receiving coil includes a first power receiving coil and a second power receiving coil, and the at least one power feeding coil includes a first power feeding coil and a second power feeding coil,
wherein a first resonance circuit including the first heater and the first power receiving coil is formed, a second resonance circuit including the second heater and the second power receiving coil is formed, and a first resonance frequency, which is a resonance frequency of the first resonance circuit, and a second resonance frequency, which is a resonance frequency of the second resonance circuit, are different from each other, and
wherein the radio-frequency power supply unit includes a first power feeding part configured to feed, to the first power feeding coil, radio-frequency power having a frequency corresponding to the first resonance frequency, and a second power feeding part configured to feed, to the second power feeding coil, radio-frequency power having a frequency corresponding to the second resonance frequency.

2. The substrate processing apparatus of claim 1, wherein the first power receiving coil is a donut-shaped coil arranged in a first ring-shaped region centered on the rotation axis and having a first distance from the rotation axis,
the second power receiving coil is a donut-shaped coil arranged in a second ring-shaped region centered on the rotation axis and having a second distance from the rotation axis, the second distance being greater than the first distance,
the first power feeding coil is a donut-shaped coil arranged at a position facing the first power receiving coil, regardless of a rotation phase of the rotary stage, and
the second power feeding coil is a donut-shaped coil arranged at a position facing the second power receiving coil, regardless of the rotation phase of the rotary stage.

3. The substrate processing apparatus of claim 2, wherein the first heater is arranged to heat a ring-shaped region on a center side of the rotary stage, and the second heater is arranged to heat a ring-shaped region on a peripheral side of the rotary stage.

4. The substrate processing apparatus of claim 1, wherein the first power receiving coil and the second power receiving coil are coils respectively arranged in first and second portions, which are located at different circumferential positions in a ring-shaped power receiving coil arrangement region having a first distance from the rotation axis, the first power feeding coil and the second power feeding coil are coils respectively arranged in third and fourth portions, which are located at different circumferential positions in a ring-shaped power feeding coil arrangement region having the first distance from the rotation axis, and depending on a rotation phase of the rotary stage, a state in which the first power receiving coil and the first power feeding coil face each other and a state in which the first power receiving coil and the first power feeding coil do not face each other are switched, and a state in which the second power receiving coil and the second power feeding coil face each other and a state in which the second power receiving coil and the second power feeding coil do not face each other are switched.

5. The substrate processing apparatus of claim 1, wherein the first heater and the second heater are installed to be capable of heating different regions of the rotary stage, and are configured to be capable of heating different regions in a plane of the substrate held on the rotary stage.

6. The substrate processing apparatus of claim 1, further comprising:
a first ferrite disposed between the first power receiving coil and the second power receiving coil; and
a second ferrite disposed between the first power feeding coil and the second power feeding coil.

7. A substrate processing apparatus comprising:
a rotary stage configured to hold a substrate;
a rotary driver configured to rotate the rotary stage around a rotation axis;
at least one electric heater installed in the rotary stage;
at least one power receiving coil installed in the rotary stage and electrically connected to the at least one electric heater;
at least one power feeding coil installed to face the at least one power receiving coil in a direction of the rotation axis with a gap between the at least one power feeding coil and the at least one power receiving coil; and
a radio-frequency power supply unit configured to supply radio-frequency power to the at least one power feeding coil,
wherein the at least one electric heater includes a first heater and a second heater, the at least one power receiving coil includes a first power receiving coil and a second power receiving coil, and the at least one power feeding coil includes one first power feeding coil configured to feed power to the first power receiving coil and the second power receiving coil,
wherein a first resonance circuit including the first heater and the first power receiving coil is formed, a second resonance circuit including the second heater and the second power receiving coil is formed, and a first resonance frequency, which is a resonance frequency of the first resonance circuit, and a second resonance frequency, which is a resonance frequency of the second resonance circuit, are different from each other, and
wherein the radio-frequency power supply unit is configured to have a variable output frequency such that radio-frequency power having a frequency corresponding to the first resonance frequency and radio-frequency power having a frequency corresponding to the second resonance frequency can be selectively supplied to the first power feeding coil.

8. The substrate processing apparatus of claim 7, wherein the first power receiving coil is a donut-shaped coil arranged in a first ring-shaped region centered on the rotation axis and having a first distance from the rotation axis,
the second power receiving coil is a donut-shaped coil arranged in a second ring-shaped region centered on the rotation axis and having a second distance from the rotation axis, the second distance being greater than the first distance, and
the first power feeding coil is a donut-shaped coil arranged to face both the first power receiving coil and the second power receiving coil, regardless of a rotation phase of the rotary stage.

9. The substrate processing apparatus of claim 7, wherein the first power receiving coil and the second power receiving coil are coils respectively arranged in first and second portions, which are located at different circumferential positions in a ring-shaped power receiving coil arrangement region having a first distance from the rotation axis, and
the first power feeding coil is a donut-shaped coil arranged to face both the first power receiving coil and the second power receiving coil, regardless of a rotation phase of the rotary stage.

10. The substrate processing apparatus of claim 7, further comprising:
a ferrite disposed between the first power receiving coil and the second power receiving coil.

11. A substrate processing apparatus comprising:
a rotary stage configured to hold a substrate;
a rotary driver configured to rotate the rotary stage around a rotation axis;
at least one electric heater installed in the rotary stage;
at least one power receiving coil installed in the rotary stage and electrically connected to the at least one electric heater;
at least one power feeding coil installed to face the at least one power receiving coil in a direction of the rotation axis with a gap between the at least one power feeding coil and the at least one power receiving coil;
a radio-frequency power supply unit configured to supply radio-frequency power to the at least one power feeding coil; and
a ferrite disposed between a power receiving coil arrangement region in which the at least one power receiving coil is arranged and a heater arrangement region in which the at least one electric heater is arranged.

12. A substrate processing apparatus comprising:
a rotary stage configured to hold a substrate;
a rotary driver configured to rotate the rotary stage around a rotation axis;
at least one electric heater installed in the rotary stage;
at least one power receiving coil installed in the rotary stage and electrically connected to the at least one electric heater;
at least one power feeding coil installed to face the at least one power receiving coil in a direction of the rotation axis with a gap between the at least one power feeding coil and the at least one power receiving coil;
a radio-frequency power supply unit configured to supply radio-frequency power to the at least one power feeding coil; and
a ferrite disposed between a power feeding coil arrangement region in which the at least one power feeding coil is arranged and an electric motor constituting the rotary driver.

13. A substrate processing apparatus comprising:
a rotary stage configured to hold a substrate;
a rotary driver configured to rotate the rotary stage around a rotation axis;

at least one electric heater installed in the rotary stage;

at least one power receiving coil installed in the rotary stage and electrically connected to the at least one electric heater;

at least one power feeding coil installed to face the at least one power receiving coil in a direction of the rotation axis with a gap between the at least one power feeding coil and the at least one power receiving coil;

a radio-frequency power supply unit configured to supply radio-frequency power to the at least one power feeding coil;

at least one non-contact-type temperature sensor configured to detect a surface temperature of the rotary stage or a surface temperature of the substrate held on the rotary stage; and a temperature controller configured to control radio-frequency power output from the radio-frequency power supply unit to the at least one power feeding coil based on the surface temperature detected by the at least one non-contact-type temperature sensor such that a temperature of the rotary stage or a temperature of the substrate reaches a target value.

14. The substrate processing apparatus of claim 13, wherein the radio-frequency power supply unit includes a zero-cross circuit.

\* \* \* \* \*